United States Patent [19]

von Trebra et al.

[11] Patent Number: 5,360,688

[45] Date of Patent: Nov. 1, 1994

[54] COMPOSITE BLACK AND WHITE SUBSTRATE FOR COLOR PROOFING FILMS

[75] Inventors: Robert J. von Trebra, Wheeling, Ill.; Dennis J. Bellville, Yorba Linda, Calif.

[73] Assignee: Hoechst Celanese Corporation, Somerville, N.J.

[21] Appl. No.: 156,500

[22] Filed: Nov. 23, 1993

Related U.S. Application Data

[60] Division of Ser. No. 929,089, Aug. 12, 1992, Pat. No. 5,288,570, which is a continuation-in-part of Ser. No. 577,949, Sep. 5, 1990, abandoned.

[51] Int. Cl.$^5$ .......................... G03C 11/12; G03F 9/00
[52] U.S. Cl. ...................................... 430/22; 430/253; 430/254; 430/257; 430/258; 430/952
[58] Field of Search ................ 430/22, 253, 254, 257, 430/258, 952, 510, 939, 950

[56] References Cited

U.S. PATENT DOCUMENTS

| | | | |
|---|---|---|---|
| 2,773,769 | 12/1956 | Goldschein | 430/510 |
| 3,091,535 | 5/1963 | Milner | 430/510 |
| 3,629,054 | 12/1971 | De Keyser et al. | 430/510 |
| 3,772,015 | 11/1973 | Kirsch | 96/30 |
| 3,796,575 | 3/1974 | Kirsch et al. | 96/14 |
| 3,798,034 | 3/1974 | Laridon | 430/254 |
| 4,144,064 | 3/1979 | Vermeulen et al. | 430/510 |
| 4,262,071 | 4/1981 | Larson | 430/11 |
| 4,489,154 | 12/1984 | Taylor, Jr. | 430/253 |
| 4,563,406 | 1/1986 | Ohbayashi et al. | 430/510 |
| 4,579,810 | 4/1986 | Johnson et al. | 430/536 |
| 4,710,444 | 12/1987 | Leenders et al. | 430/257 |
| 4,735,892 | 4/1988 | Orpwood et al. | 430/323 |
| 4,980,260 | 12/1990 | Shimozaki et al. | 430/138 |
| 5,246,812 | 9/1993 | von Trebra et al. | 430/253 |

OTHER PUBLICATIONS

Todd et al., *Photographic sensitometry*, C1969, Morgan and Morgan Inc., Hastings–on–Hudson, N.Y., pp. 49 and 50.

L. P. Clerc, *Photography therory and practice I fundamentals*, C1970, Focal Press Limited, N.Y., pp. 16 and 17.

*Primary Examiner*—Richard L. Schilling
*Attorney, Agent, or Firm*—Palaiyur S. Kalyanaraman

[57] ABSTRACT

A composite film article which is a flexible, heat resistant, polymeric film material having a non-opaque, partially translucent white surface side, having a visible light opacity of from about 0.90 to about 0.99; and a non-opaque, black surface side having a visible light opacity of less than 1.0, a transmission density of less than about 2.0 and a thickness less than about 5.0 microns. The article may be used as a base for images such that the images have a reduced optical dot gain.

31 Claims, No Drawings

COMPOSITE BLACK AND WHITE SUBSTRATE FOR COLOR PROOFING FILMS

This is a divisional of copending application Ser. No. 07/929,089 filed Aug. 12, 1992, now U.S. Pat. No. 5,288,570, which is a continuation-in-part of Ser. No. 07/577,949, filed Sep. 5, 1990, now abandoned.

BACKGROUND OF THE INVENTION

The present invention relates to an improved substrate for color proofing films which has a white, reflective, non-opaque, partially translucent side and an opposite non-opaque black or dark side. The composite substrate is used to produce color proofing films demonstrating reduced dot gain compared to opaque white substrates.

Color proofing systems are well known and are broadly disclosed in the prior art. The progressing from an original armwork through a series of color separations, and the use of these separations to produce color proofs is well known in the art. Color proofing films are used to assist a printer in correcting a set of color separations which will be used in exposing expensive lithographic printing plates. The proof should reproduce the image and color quality that will be obtained during the printing process. Visual examination of a color proof should reveal the color rendition to be expected from a press using the color separations, and any defects on the separations which might need to be altered before making the printing plates.

Color proofs can be made by using a printing press which is known as a proof press. This requires that all of the actual printing steps be formed and this conventional method of color proofing is costly and time consuming. Alternate color proofing methods have therefore been developed to simulate the quality of press proofs. There are two general types of photoimaging methods used to make a color proof, namely the overlay type and the single sheet type. In the overlay color proofing system, an independent transparent plastic support is used for producing a colored image of each color separation film. A number of such supports carrying the various colored images of cyan, yellow, magenta and black are then superimposed upon each other and placed on a white sheet to produce a color proof. An advantage of the overlay system is that the process is quick and economical. However, the transparent sheets between each color tend to distort the final image. In the single sheet color proofing method, a color proof is prepared by successively producing images of the colors from different color separation films onto a single receiver sheet. This is done by using a single opaque support and by applying toners, photosensitive solutions, or coatings of photosensitive materials of corresponding colors to the opaque support in succession. Examples of this approach are described in U.S. Pat. Nos. 3,671,236; 4,260,673; 4,366,223; 4,650,738; 4,656,114; and 4,659,642 which are incorporated herein by reference. An advantage of the single sheet type of color proof is that the color is not influenced by superimposed plastic supports. This method more closely resembles actual printing and eliminates the color distortion inherent in the overlay system. U.S. Pat. No. 4,596,757 provides a method for transferring images or solid colors which are subsequently imaged. The photosensitive material comprises a carrier support sequentially bearing a release layer; a colored, photopolymerizable layer; and an adhesive layer. The material can undergo exposure, lamination a temporary support, wet development, and then lamination to a final base sheet.

Images can also be produced by a peel apart method. Peel apart color proofing systems are known in the art as exemplified by U.S. Pat. No. 4,489,154. In peel apart color proofing, a photosensitive layer is disposed between two self supporting sheets. Upon exposure, there is an imagewise difference in adhesion between the exposed and unexposed portions of the photosensitive image to one of the two sheets forming the photosensitive element. Upon exposure and separation of the two sheets, a positive image is formed on one sheet and a negative image on the other.

Clearly, in the manufacture of color proofing films, it is desired that the images made from an original should represent a consistent reproduction of tonal values, and reproduce the quality seen in the originals. However, often, when these high quality color proofing separations are compared to the final output of a printing press, the results do not always correspond. This is because the printing press produces a halftone dot size on paper that varies from the halftone dots on the color proof. The result is what is called "dot gain". It manifests itself by the spreading out of ink on the printed sheet to cover an area different from that on the printing plate or color proofing originals. This problem has been recognized in the printing industry and techniques have been evolved to adjust for these variations. Dot gain can be useful in color proofing films because it simulates the mechanical gain which occurs on the press. However, there are situations where it is desired reduce the amount of dot gain. For example, when trying to simulate the dot gain of sheet fed presses or the printing done using positive working lithographic plates.

It has been found that the substrate on which the final color proofing image appears contributes to a difference in optical dot gain on the proof. This is disadvantageous since it contributes to the production of an image which is not a faithful reproduction of the original image. The prior art has recognized this problem and has sought to achieve a receiver base for image transfer which does not increase apparent dot gain. In one example, U.S. 4,579,810 discloses a multicolor proof having a pearlescent support. It has now been found that dot gain can be controlled using a partially translucent support which is white on one side and has a dark, preferably black surface on the opposite side. The white side allows an accurate reflective background base from which to view the colors of the image. White backgrounds, while themselves well known in the art are also transmissive to part of the light cast upon them. Since the background materials, usually white polyester films, have a certain thickness, they tend to reflect part of this transmitted light back through the image in a diffuse fashion and cause a shadow which is viewed as a gain in dot size. This invention solves this problem by providing the opposite side of the support with a dark, non-reflecting, preferably black surface. This causes the inevitable reflections to be much more coherent rather than diffuse, thereby substantially reducing shadow and hence dot gain.

One might assume that the same result could be attained by employing a white base which is completely opaque. However, it has been found that in order to correctly register sequential image separated halftone images as is necessary in color proofing, the receiver support must have a certain minimum amount of translucency. Importantly, the dark side also cannot be completely opaque, and must have a certain amount of capacity to transmit visible light. The white side cannot be too transmissive to light or the dark color from the underlying black surface will give the composite film a muddy appearance. The present invention provides an improved white receiver base for color proofing images which allows image registration and yet reduces optical dot gain to thereby allow a truer rendition of the original colored image. The base may either comprise a single polyester sheet with a white side and a black side, or it may be a laminate of a white film adhered to a black film. In one embodiment, the black side may have an additional white coating or white film juxtaposed with it so that two images may appear on opposite sides of a single document.

SUMMARY OF THE INVENTION

The invention provides a composite film article comprising a flexible, heat resistant, polymeric film material having two sides, a first non-opaque, partially translucent white side, having a visible light opacity of from about 0.90 to about 0.99; and a second non-opaque, black side having a visible light opacity of less than 1.0. The black layer has a transmission density of less than about 2.0, preferably between about 1.0 and 2.0; and has the least thickness that is practical, preferably less than about 5.0 microns, more preferably from about 1.0 to about 5.0 microns. The thinness of the black layer minimizes the depth of penetration of reflected light into the black layer. This article may be used to produce photographic elements which comprise an image disposed on the white side.

To this latter end, the invention also provides a method of producing a positive color proofing image having reduced dot gain which comprises:

(A) providing a photosensitive element which comprises, in order:
(i) a transparent support preferably having an adhesion promoted surface; and (ii) a photosensitive composition layer on said adhesion promoted surface, which photosensitive layer comprises an organic binding resin, a colorant, a photoinitiator, and a free radical polymerizable acrylate or methacrylate component having at lease two ethylenically unsaturated groups, wherein said binding resin is present in sufficient amount to bind the composition components into a uniform film, and wherein said colorant is present in sufficient amount to uniformly color the composition, and wherein said photoinitiator is present in sufficient amount to initiate the free radical polymerization of said polymerizable component upon exposure to sufficient actinic radiation, and wherein said polymerizable component is present in sufficient amount to provide image differentiation when the composition is image-wise exposed to actinic radiation; and (iii) an adhesive layer directly adhered to said colored, photosensitive layer, which adhesive layer comprises a thermoplastic resin which has a $T_g$ in the range of from about 25° C. to about 100° C.; and providing a receiver base which is a composite film article comprising a flexible, heat resistant, polymeric film material having two sides, a first non-opaque, partially translucent white side, having a visible light opacity of from about 0.90 to about 0.99; and a second non-opaque, black side having a visible light opacity of less than 1.0, a transmission density of less than about 2.0 and a thickness of less than about 5.0 microns; and (B) either
(i) laminating said adhesive layer to said receiver base at elevated temperature and pressure; and then image-wise exposing said photosensitive composition through the transparent support to actinic radiation; or
(ii) image-wise exposing said photosensitive composition to actinic radiation; and then laminating said adhesive layer to said receiver base at elevated temperature and pressure; and (C) peeling apart said support and said receiver base, thereby transferring the adhesive layer and the image-wise nonexposed portions of the colored, photosensitive composition to the receiver base while the image-wise exposed portions remain on the adhesion promoted surface of the support; and (D) optionally repeating steps (A) through (C) at least once wherein another photosensitive element produced according to step (A) and having at least one different colorant is transferred to the adhesive layer and imagewise nonexposed portions of the previously processed photosensitive element on said receiver base.

The invention also provides an improved method for forming a colored image which comprises:

A. providing a receiver base which is a composite film article comprising a flexible, heat resistant, polymeric film material having two sides, a first non-opaque, partially translucent white side, having a visible light opacity of from about 0.90 to about 0.99; and a second non-opaque, black side having a visible light opacity of less than 1.0, a transmission density of less than about 2.0 and a thickness of less than about 5.0 microns: and B. providing a photosensitive element which comprises in order:
i) a substrate having a release surface; and ii) a photosensitive layer on said release surface, which photosensitive layer comprises a light sensitive component selected from the group consisting of negative working, polymeric diazonium compounds or positive working quinone diazide compounds or photopolymerizable compositions in an amount sufficient to photosensitize the layer; and a resinous binder composition in an amount sufficient to bind the layer components into a uniform film; and at least one colorant in an amount sufficient to uniformly color the layer; and iii) an optional, nonphotosensitive, colorless adhesive layer directly adhered to said colored photosensitive layer, which adhesive layer has a softening point in the range of from about 60° C. to about 180° C.; and
C. either
i) laminating said photosensitive element with heat and pressure via said photosensitive or adhesive layer of the photosensitive element to one side of said receiver sheet composite; and removing said substrate by the application of peeling forces; and imagewise exposing said photosensitive layer to actinic radiation; or
ii) imagewise exposing said photosensitive layer to actinic radiation; and laminating said photosensitive element with heat photosensitive element to one side of said receiver sheet composite; and removing said substrate by the application of peeling forces; or
iii) laminating said photosensitive element with heat and pressure via said photosensitive or adhesive layer of the photosensitive element to one side of said receiver sheet composite; and imagewise exposing said photosensitive layer to actinic radiation; and removing said substrate by the application of peeling forces; and thereafter D. removing the nonimage areas of said photosensitive layer with a liquid developer, which removing is conducted at a temperature at which said photosensitive element is substantially nontacky; and thereafter E. optionally repeating steps (A) through (D) at least once wherein another photosensitive element produced according to step (A) and having at least one different colorant is laminated onto the nonremoved portions of the previously processed photosensitive layer or layers on the receiver sheet composite.

The invention also provides the photosensitive articles which are produced by the aforesaid methods.

DETAILED DESCRIPTION OF THE PREFERRED EMBODIMENT

In the preparation of the composite film article of this invention, one may use virtually any material flexible, self-supporting, heat resistant, polymeric film which can withstand the laminating and wet or dry development processes hereinafter mentioned. In the preferred embodiment, the substrate is composed of a dimensionally and chemically stable base material which does not significantly change its size, shape, or chemical properties as the result of the heating, coating, or other treatments which it must undergo. Polyester sheets are preferred and polyethylene terephthalate is most preferred. In the usual case it has a thickness of from about 1 to about 10 mils, a more preferred thickness is from about 3 to about 7 mils, and most preferably from about 5 to about 7 mils.

One side of the composite film article is white and one side is black. The white side has a non-opaque, partially translucent white side having a visible light opacity of from about 0.90 to about 0.99, or more preferably from about 0.95 to about 0.99 and most preferably from about 0.95 to about 0.98. The black side has: 1) a non-opaque, black surface having a visible light opacity of less than 1.0, or preferably from about 0.30 to about 0.99, more preferably from about 0.4 to about 0.99, and most preferably from about 0.4 to about 0.95; 2) a transmission density of less than about 2.0, preferably from about 1.0 to about 2.0; and 3) a thickness of less than about 5.0 microns, preferably from about 1.0 to about 5.0 microns.

One method of preparing the composite film article is to produce an integral white and an integral black polyester film each having the requisite degree of opacity, and then adhering the two films with a suitable adhesive. Such sheet may be prepared by blending a white or black pigment in with polyethylene terephthalate prior to biaxial orientation. In another method, a white or black pigment containing composition is coated onto a polyester sheet. One white pigment is titanium dioxide. One black pigment is carbon black. The amount of pigment required for the desired opacity may be determined easily by the skilled artisan. In one preferred embodiment, an integral white colored polyester sheet is provided with a black coating. In another embodiment, an integral black colored polyester sheet is provided with a white coating. In another embodiment, an integral black polyester sheet is provided with a white layer on each of its opposite sides to provide a base sheet which can bear two distinct images.

One integral white plastic sheet is Melinex 994 polyester from ICI. This is basically a customarily produced polyethylene terephthalate film where a white colorant is incorporated into the polymer melt before extrusion and biaxial orientation. In the embodiment of the invention wherein a white and a black polyester sheet are adhered by an adhesive, the films are preferably adhered by a pressure or heat sensitive adhesive layer. The adhesive is preferably colorless and developer resistant. This layer comprises a major amount of one or more thermoplastic polymers. Virtually any thermoplastic polymer may be used for this purpose. Suitable thermoplastic polymers nonexclusively include vinyl acetal resins such as Butvar B-79 available from Monsanto; acrylic resins such as Elvacite 2044 available from DuPont; ethylene resins such as Elvax 210 available from DuPont; ethylene/vinyl acetate copolymers such as Elvax 40-W and 150-W available from DuPont; and vinyl chloride resins such as Hostaflex CM 133 available from Hoechst AG. Preferably the polymer is a vinyl acetate polymer or copolymer. The two films are merely adhered to each other to form the composite.

The most preferred embodiment is one which uses an integral white polyester sheet provided with a black coating. This is the most preferred for its simplicity of construction. Also, since a goal of the invention is to reduce dot gain caused by dot shadows which is caused by diffusion and reflection through the substrate, the fewer the layers, the less diffusion.

In one embodiment of the invention, the composite film article comprises an integral white polyester sheet which has a black, non-opaque coating disposed on one of its surfaces. Coating processes are well known in the art. Typically, a black pigment, such as carbon black is mixed with a carrier such as styrene/maleic anhydride copolymers and their half esters; acrylic polymers and copolymers; polyamides; polyvinyl pyrrolidones; cellulose and its derivatives; phenolic resins; and polyvinyl acetals, such as polyvinyl formal, polyvinyl butyral, and polyvinyl propional. The amount of pigment in the coating is adjusted to provide the desired degree of opacity of the black surface. This composition may be mixed with a suitable diluent or other coating solvent and the composition deposited or otherwise applied onto one side of the sheet, and dried. If the coating is white, a mixture of a white pigment and one of the aforementioned binders is used.

In the preparation of a full color proof, four separate colored images are formed, namely cyan, yellow, magenta, and black. When the images are superimposed upon each other, a simulated full color reproduction results. One begins the process of the present invention by preparing a composite film material as mentioned above and then using it as a receiver sheet for an image. Preferably the image is formed by laminating, exposing and developing a colored, photosensitive layer on the composite film material as a receiver sheet.

In the usual case, an image comprises a series of four or more color separated image portions. The image may be produced by any of several methods known in the art for image transfer, full layer or peel apart processing. The most preferred image preparation methods are those described in U.S. Pat. Nos. 4,650,738 and 4,659,642 which are incorporated herein by reference. These methods relate to positive and negative working photographic elements which broadly comprise a photographic element which is a colored photosensitive layer on a temporary support and an adhesive layer on the photosensitive layer. The element is laminated to the receiver, the temporary support removed and exposed in any order, and then developed. In the usual case another photographic element having another color is then applied to the previous image.

The temporary support for the photosensitive layer may comprise virtually any material flexible, self-supporting, heat resistant, polymeric film which can withstand the laminating and wet or dry development processes usual in the photographic arts. In the preferred embodiment, the substrate is composed of a dimensionally and chemically stable base material which does not significantly change its size, shape, or chemical properties as the result of the heating, coating, or other treatments which it must undergo. Polyester sheets are preferred and polyethylene terephthalate is most preferred. In the usual case it has a thickness of from about 1 to about 10 mils, a more preferred thickness is from about 2 to about 5 mils, and most preferably from about 2 to about 3 mils. As mentioned before, in certain embodiments, the polyester sheet is transparent. Suitable films include Hostaphan 3000, available from Hoechst Celanese Corporation; Hostaphan 4400, 4500, and 4540 available from Hoechst AG; Mylar D, available from DuPont; and Melinex 516, 054, 504, 505, 582, available from ICI. They may have subbing layers. Examples of adhesion pretreatment subbing layers are disclosed in U.S. Pat. No. 2,627,088. In other embodiments, the support is an integral white plastic sheet. The aforementioned Melinex 994 polyester from ICI, is useful for this purpose.

In preparing a photosensitive element, the photosensitive layer broadly comprises a photosensitizer, a colorant, a binding resin, and other optional ingredients such as plasticizers, stabilizers, surfactants, antistatic compositions, uv absorbers, photoactivators, antihalation agents, hydrogen atom donors, exposure indicators, optical brighteners, inert fillers. polymerization inhibitors, spectral sensitizers, and residual coating solvents.

In one embodiment, photosensitizer is preferably a light sensitive, negative working polymeric diazonium salt. The most preferred photosensitizer is the polycondensation product of 3-methoxy-4-diazo-diphenylamine sulfate and 4,4'-bis-methoxy methyl-diphenyl ether, precipitated as mesitylene sulfonate as taught in U.S. Pat. No. 3,849,392. Other suitable photosensitizers are taught in U.S. 4,436,804. The diazo compounds of choice are preferably soluble in organic solvents.

In another embodiment, the photosensitizer is preferably a light sensitive, naphthoquinone diazide. The most preferred photosensitizer is the ester of bis-(3-benzoyl-4,5,6-trihydroxy phenyl)-methane and 2-diazo-1-naphthol-5-sulfonic acid as taught in U.S. Pat. No. 4,407,426. Other suitable photosensitizers are taught in U.S. Pat. Nos. 4,266,001; 3,106,365; 3,148,983 and 3,201,239. The diazo compounds of choice are preferably soluble in organic solvents.

In yet another embodiment, the photosensitizer comprises a photopolymerizable monomer or oligomer component, and a photoinitiator. Examples of such photosensitizers are given in U.S. Pat. No. 4,596,757. The photopolymerizable material contained in the colored layer usually comprises an addition polymerizable, nongaseous (boiling temperature above 100° C. at normal atmospheric pressure), ethylenically-unsaturated compounds containing at least two terminal ethylene groups, and being capable of forming a high molecular weight polymer by free radical initiated, chain propagating addition polymerization. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylane, pentaerythritol tetraacrylate, trimethylol propane triacrylate, trimethylol propane trimethacrylate, di-pentaerythritoi monohydroxypentaacrylate, pentaerthritol triacrylate, bisphenol A ethoxylate dimethacrylate, trimethylolpropane ethoxylane triacrylate, and trimethylolpropane propoxylate triacrylate.

Free radical liberating photoinitiators include any compound which liberates free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon-substituted aromatic acyloins in U.S. Pat. No. 2,722,512; polynuclear quinones in U.S. Pat. Nos. 2,951,758 and 3,046,127; and s-triazines in U.S. Pat. No. 4,656,272.

Dyes and/or pigments are included in the photosensitive layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer. Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (C.I. 73915), Hostaperm Red Violet ER (C.I. 46500), Permanent Carmine FBB (C.I. 12485), Hostaperm Blue B2G (C.I. 74160), Hostaperm Blue A2R (C.I. 74160), and printex 25. Most of these pigments are products of Hoechst AG. They can be used separately or blended for a desired ccior.

Binders found suitable for the photosensitive layer are styrene/maleic anhydride copolymers and their half esters; acrylic polymers and copolymers; polyamides; polyvinyl pyrrolidones; cellulose and its derivatives; phenolic resins; and polyvinyl acetals, such as polyvinyl formal, polyvinyl butyral, and polyvinyl propional.

Dyes may be included to spectrally sensitize the photoinitiator, such as described in U.S. Pat. Nos. 4,282,309 and 4,454,218, and European Patent Applications 0,179,448 and 0,211,615.

In the practice of the present invention, the binder component is preferably present in the photosensitive layer in an amount sufficient to bind the composition components in a uniform mixture and a uniform film when it is coated on a substrate. It is preferably present in an amount ranging from about 10% to about 80% based on the weight of the solids in the layer. A more preferred range is from about 20% to about 70%.

In the preferred embodiment, when a diazonium salt or diazide compound is the photosensitizer component, it is present in the photosensitive layer in an amount of from about 5 to about 70 percent by weight; more preferably from about 10 to about 50 percent by weight.

In the practice of the present invention, when a photoinitiator compound is used, it is preferably present in the photosensitive layer in an amount sufficient to initiate the free radical polymerization of the unsaturated component upon exposure to imaging energy. It is preferably present in an amount ranging from about 2% to about 30% based on the weight of the solids in the layer. A more preferred range is from about 6% to about 20%.

In the practice of the present invention, the colorant component is preferably present in an amount sufficient to uniformly color the photosensitive layer. It is preferably present in an amount ranging from about 5% to about 50% based on the weight of the solids in the layer. A more preferred range is from about 10% to about 40%.

In the practice of the present invention, when an unsaturated component is used, it is preferably present in the photosensitive layer in an amount sufficient to cause an imagewise latent differential in the polymerizable composition when it is coated on a substrate and imagewise exposed to imaging energy. It is preferably present in an amount ranging from about 10% to about 60% based on the weight of the solids in the layer. A more preferred range is from about 15% to about 40%.

The photoactivator which may be included in the composition of this invention should be an amine-containing photoactivamor which combines synergistically with the free-radical photoinitiator in order to extend the effective half-life of the photoinitiator, which is normally in the approximate range of about $10^{-9}$ to $10^{-15}$ seconds. Suitable photoactivators include 2-(N-butoxy) ethyl-4-dimethylamino benzoate, 2-(dimethylamino) amino benzoate, and acrylated amines.

A plasticizer may also be included in the composition of this invention to prevent coating brittleness to keep the composition pliable if desired. Suitable plasticizers include dibutylphthalate, dioctylphthalate, triarylphosphate and substituted analogs thereof.

To form a coating composition for the production of the photosensitive elements, the composition of this invention may be dissolved in a solvent or mixture of solvents to facilitate application of the composition to the substrate. Suitable solvents for this purpose may include water, tetrahydrofuran, gamma butyrolactone, glycol ethers such as propylene glycol monomethyl ether and methyl cellosolve, alcohols such as ethanol and n-propanol and ketones such as methyl ethyl ketone. In general, the solvent system is evaporated from the coating composition once it is applied to an appropriate substrate. However, some insignificant amount of solvent may remain as residue.

In the preferred embodiment, the photosensitive layer has a coating weight between approximately 0.1 and 5.0g/m$^2$. The most preferred weight is from about 0.5 to 2.0g/m$^2$.

The purpose of the optional adhesive layer on the photosensitive layer is to aid in the transfer of the photosensitive layer and to protect the integrity of underlying, previous formed images during development of subsequent layer or layers. It may be applied to the photosensitive layer in several different ways. It can be coated directly onto the photosensitive layer out of organic or aqueous based solvent mixtures, or it can be applied by hot melt extrusion, lamination, or coating. The optional adhesive layer preferably comprises a major amount of one or more thermoplastic polymers and may optionally contain such other desired components as uv absorbers, antistatic compositions, optical brighteners, inert fillers, and plasticizers. Suitable polymers nonexclusively include vinyl acetal resins such as Butvar B-79 available from Monsanto; acrylic resins such as Elvacite 2044 available from DuPont; ethylene resins such as Elvax 210 available from DuPont; and vinyl chloride resins such as Hostaflex CM 133 available from Hoechst AG. Preferably the polymer is a vinyl acetate polymer or copolymer.

Useful polyvinyl acetates nonexclusively include Mowillth DM-6, DM-22, 20, 25, 30 and mixtures thereof, available from Hoechst AG. These are usually dispersed in water, or dissolved in methyl isobutyl ketone or n-butyl acetate or other solvent compositions for coating on the photosensitive layer. It is then dried to a coating weight of from about 2 to about 30g/m$^2$, more preferably from about 4 to about 20g/m$^2$. The layer may optionally contain a uv absorber such as Uvinul D-50 available from GAF. It may also contain a plasticizer such as Resoflex R-296, available from Cambridge Industries. It may also contain antistats, such as Gafac and Gafstat available from GAF. It may also contain other resins such as Nitrocellulose RS ½, available from Hercules. The adhesive layer should not be tacky to the touch during storage or during development of the photosensitive element. The layer should be transferable in the range of from about 60° C. to 180° C., preferably 60° C. to 120° C., more preferably 60° C. to 100° C. when laminated with heat and pressure. In the preferred embodiment, the thermoplastic polymer or polymers are present in the adhesive layer in an amount of greater than about 50% by weight. The plasticizer may be present in an amount of up to about 30% by weight, the uv absorber up to about 20% by weight, and other resins up to about 50% by weight.

Typical adhesive formulations for the photosensitive element nonexclusively include.

| | | |
|---|---|---|
| I. | Water | 50.00 |
| | Mowilith DM-22 | 50.00 |
| II. | n-butyl acetate | 78.00 |
| | Resoflex R-296 | 1.00 |
| | Mowilith 30 | 21.00 |
| III. | n-butyl acetate | 68.70 |
| | Uvinul D-50 | 1.30 |
| | Mowilith 20 | 30.00 |
| IV. | n-butyl acetate | 85.00 |
| | Mowilith 60 | 15.00 |

In operation, the photosensitive element is laminated to one side of the receiver sheet composite via the photosensitive layer or adhesive layer of the photosensitive element if present. Lamination may be conducted by putting together the photosensitive element and receiver sheet composite in the proper configuration and then introducing the two materials into the nip of a pair of heated laminating rollers under suitable pressure. Suitable laminating temperatures usually range from about 60° C. to about 180° C., preferably about 60° C. to about 120° C. After lamination, the substrate is peeled away, usually merely employing manual peeling forces. The photosensitive layer plus the adhesive layer of the photosensitive element when used thus remains on top of the composite. The photosensitive layer is imagewise exposed by means well known in the art either before or after lamination. Such exposure may be conducted by exposure to a uv light source through a color separation under vacuum frame conditions. Exposures after lamination and support removal are preferred for emulsion-to-photosensitive layer contact. Mercury vapor discharge lamps are preferred over metal halide lamps. Other radiation sources, such as carbon arcs, pulsed xenon lamps, and lasers, may also be used. Light absorbing filters may be used to reduce light scattering in the material.

After transfer and exposure, the photosensitive layer may be developed by dissolving the nonimage areas in a suitable developer and dried. Suitable developers nonexclusively include:

|  |  | Weight Percent |
|---|---|---|
| I. | water | 95.0 |
|  | sodium decyl sulphate | 3.0 |
|  | disodium phosphate | 1.5 |
|  | sodium metasilicate | 0.5 |
| II. | water | 89.264 |
|  | monosodium phosphate | 0.269 |
|  | trisodium phosphate | 2.230 |
|  | sodium tetradecyl sulfate | 8.237 |

Any developer solution which satisfactorily removes the nonimage areas of the photosensitive layer after exposure while retaining the image areas may be used. The selection of developer is well within the ability of the skilled artisan. Development is performed at temperatures below that at which the photosensitive element is nontacky.

The process can then be repeated whereby another photosensitive element having a different color is laminated to the same receiver sheet composite over the previously formed image. In the usual case, four colored layers are employed to produce a full color reproduction of a desired image. These are cyan, magenta, yellow and black. Optionally one can laminate a protective layer over the thusly produced image.

In another embodiment of the invention, the image is formed by a dry peel apart development. In the peel apart method, after lamination of the photosensitive and adhesive layers and its support to the receiver base and after exposure of the photosensitive layer, the photosensitive layer is dry developed by stripping the support from the receiver base at room temperature with a steady, continuous motion. The preferred peel angle relative to the peel direction is greater than 90°. The delamination leaves the photoexposed areas on the temporary support and the nonexposed areas on the adhesive layer. The adhesive layer remains with the receiver base. Thus, an image with the adhesive remains on the receiver base. Another photosensitive layer is laminated via another adhesive to the first image on the receiver base. The second photosensitive layer has a different color than the first and is exposed through the appropriate color separation. After lamination to the receiver and exposure, the temporary support of the second photosensitive layer is removed as was done with the first support. The second image with its adhesive remains with the first image. A third and a fourth image may be added in a manner similar to that used to produce the second image. In the usual case, four colored layers are employed to produce a full color reproduction of a desired image. These four colors are cyan, magenta, yellow and black.

The following nonlimiting examples serve to illustrate the invention.

EXAMPLE 1

A composite receiver base was constructed by laminating a Pressmatch Negative black film (Available from Hoechst Celanese Corporation, Somerville, N.J.) to a clear polyester support sheet (Available as Melinex 505 from ICI). The black Pressmatch Negative film comprised a polyester carrier sheet, a photosensitive layer comprising a negative working diazonium salt, black colorant and binder, and an adhesive layer by a method according to U.S. Pat. No. 4,650,738. The black film had a transmission density of 1.05 and a thickness of about 1.0 micron. The white film had a transmission density of 0.56 and a reflection density of 0.07. The transparent carrier sheet was peeled away and a Melinex 994/200 white film was laminated on top of the black film.

EXAMPLE 2

A composite receiver base was constructed by laminating a Pressmatch Negative black film (Available from Hoechst Celanese Corporation, Somerville, N.J.) to a clear polyester support sheet (Available as Melinex 505 from ICI). A white dispersion of 40% by weight titanium dioxide, 5% of a polyvinyl propional resin from U.S. Pat. No. 4,666,124 and 55% solvent was coated over the black film with a #12 wire wound rod.

EXAMPLE 3

Color images were made by producing Pressmatch Negative proofs on each of the receiver bases prepared in Examples 1 and 2. Color separation images were exposed through a UGRA Plate Control Wedge (available from GATF) for each of four colors. Proofs were similarly made on a commercially available standard Pressmatch receiver stock. Dot gain was measured at the 40% and 80% dot patch of each color on the completed proofs with a Cosar 61 densitometer. The results are summarized below.

|  | Color: | | | |
|---|---|---|---|---|
| Substrate | Magenta | Yellow | Cyan | Black |
| Dot Gain at 40% | | | | |
| Example 1 | 20% | 18% | 22% | 25% |
| Example 2 | 18% | 17% | 23% | 24% |
| Standard Pressmatch | 22% | 20% | 26% | 27% |
| Dot Gain at 80% | | | | |
| Example 1 | 10% | 9% | 11% | 12% |
| Example 2 | 10% | 9% | 11% | 12% |
| Standard Pressmatch | 11% | 10% | 12% | 13% |

These results demonstrate the improved dot gain using the substrate of this invention.

What is claimed is:

1. A method of producing a positive color proofing image having reduced dot gain which comprises:
   (A) providing a photosensitive element which comprises, in order:
   (i) a transparent support optionally having an adhesion promoted surface; and
   (ii) a photosensitive composition layer on said surface which photosensitive layer comprises an organic binding resin, a colorant, a photoinitiator, and a free radical polymerizable acrylate or methacrylate component having at least two ethylenically unsaturated groups, wherein said binding resin is present in sufficient amount to bind the composition components into a uniform film, and wherein said colorant is present in sufficient amount to uniformly color the composition, and wherein said photoinitiator is present in sufficient amount to initiate the free radical polymerization of said polymerizable component upon exposure to sufficient actinic radiation, and wherein said polymerizable component is present in sufficient amount to provide image differentiation when the composition is image-wise exposed to actinic radiation; and (iii) an adhesive layer directly adhered to said colored, photosensitive layer, which adhesive layer comprises a thermoplastic resin which has a $T_g$ in the range of from about 25° C. to about 100° C.; and (B) providing a receiver base which comprises a composite film article comprising a flexible, heat resistant, polymeric film material having two sides, a first non-opaque, translucent white side, having a visible light opacity of from about 0.90 to about 0.99; and a second non-opaque, black side having a visible light opacity of less than 1.0, a transmission density of less than about 2.0 and a thickness of less than about 5.0 microns; and (C) either (i) laminating said adhesive layer to said receiver base an elevated temperature and pressure; and then imagewise exposing said photosensitive composition through the transparent support to actinic radiation; or (ii) imagewise exposing said photosensitive composition to actinic radiation; and then laminating said adhesive layer to said receiver base at elevated temperature and pressure; and (D) peeling apart said support and said receiver base, thereby transferring the adhesive layer and the imagewise nonexposed portions of the colored, photosensitive composition to the white side of the receiver base while the imagewise exposed portions remain on the adhesion promoted surface of the support; and (E) optionally repeating steps (A) through (D) at least once with another photosensitive element produced according to step (A) and having at least one different colorant, whereby said photosensitive element is transferred to the adhesive layer and imagewise nonexposed portions of the previously processed photosensitive element on said receiver base.

2. The method of claim 1 wherein said photosensitive composition comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

3. The method of claim 1 wherein said photosensitive composition comprises one or more photoinitiators selected from the group consisting of 2,3-di(4-methoxyphenyl)quinoxaline, 9-phenylacridine, bis(2,4,5-triphenyl)imidazole, and their derivatives.

4. The method of claim 1 wherein said photosensitive composition comprises one or more colorants selected from the group consisting of dyes and pigments.

5. The method of claim 1 wherein said photosensitive composition comprises one or more binding resins selected from the group consisting of styrene/maleic anhydride copolymers and their half esters; acrylic polymers and copolymers; polyamides; polyvinyl pyrrolidones; cellulosic resins; phenolic resins; and polyvinyl acetals.

6. The method of claim 5 wherein said polyvinyl acetal is a polyvinyl formal polymer or copolymer containing vinyl formal.

7. The method of claim 1 wherein said photosensitive composition further comprises one or more ingredients selected from the group consisting of spectral sensitizers, thermal polymerization inhibitors, plasticizers, oligomers, surfactants inert fillers, antihalation agents, hydrogen atom donors photoactivators, and optical brightening agents.

8. The method of claim 1 wherein the polymeric film material comprises a single integral polymeric sheet having one white side and one black side.

9. The method of claim 1 wherein the polymeric film material comprises a single, white, integral polymeric sheet having a black coating on one side thereof.

10. The method of claim 1 wherein the polymeric film material comprises a single, black, integral polymeric sheet having a white coating on one side thereof.

11. The method of claim 1 wherein the polymeric film material comprises a white polymeric sheet and a black polymeric sheet adhered at an interface.

12. The method of claim 1 further comprising an additional non-opaque, translucent white side material having a visible light opacity of from about 0.90 to about 0.99 on said black side.

13. The method of claim 1 wherein the polymeric film material comprises a single, black polymeric sheet having a white coating on both opposite sides thereof.

14. The method of claim 1 wherein the polymeric fihn material comprises two white polymeric sheets adhered at an interface to the opposite sides of a black polymeric sheet.

15. A method for forming a colored image having reduced dot gain which comprises:

(A) providing a receiver base which comprises a composite film article comprising a flexible, heat resistant, polymeric film material having two sides, a first non-opaque, translucent white side, having a visible light opacity of from about 0.90 to about 0.99; and a second non-opaque, black side having a visible light opacity of less than 1.0, a transmission density of less than about 2.0 and a thickness of less than about 5.0 microns; and (B) providing a photosensitive element which comprises in order:

i) a substrate having a release surface; and ii) a photosensitive layer on said release surface, which photosensitive layer comprises a light sensitive component selected from the group consisting of negative working polymeric diazonium compounds, positive working quinone diazide compounds and photopolymerizable compositions, in an amount sufficient to photosensitize the layer; and a resinous binder composition in an amount sufficient to bind the layer components into a uniform film; and at least one colorant in an amount sufficient to uniformly color the layer; and iii) an optional, nonphotosensitive, colorless adhesive layer directly adhered to said colored photosensitive layer, which adhesive layer has a softening point in the range of from about 60° C. to about 180° C.; and C. either i) laminating said photosensitive element with heat and pressure via said photosensitive or adhesive layer of the photosensitive element to the white side of said receiver sheet composite; and removing said substrate by the application of peeling forces; and imagewise exposing said photosensitive layer to actinic radiation; or ii) imagewise exposing said photosensitive layer to actinic radiation; and laminating said photosensitive element with heat and pressure via said photosensitive or adhesive layer of the photosensitive element to the white side of said receiver sheet composite; and removing said substrate by the application of peeling forces; or iii) laminating said photosensitive element with heat and pressure via said photosensitive or adhesive layer of the photosensitive element to the white side of said receiver sheet composite; and imagewise exposing said photosensitive layer to actinic radiation; and removing said substrate by the application of peeling forces; and thereafter (D) removing the nonimage areas of said photosensitive layer with a liquid developer, which removing is conducted at a temperature at which said photosensitive element is substantially nontacky; and thereafter (E) optionally repeating steps (A) through (D) at least once whereby another photosensitive element produced according to step (A) and having at least one different colorant is laminated onto the non-removed portions of the previously processed photosensitive layer or layers on the receiver sheet composite.

16. The method of claim 15 wherein said photosensitive layer comprises the polycondensation product of 3-methoxy-4-diazo-diphenylamine sulfate and 4,4'-bis-methoxymethyl-diphenyl ether precipitated as mesitylene sulfonate.

17. The method of claim 15 wherein said photosensitive layer comprises the ester of bis-(3-benzoyl-4,5,6-trihydroxy phenyl)-methane and 2-diazo-1-naphthol-5-sulfonic acid.

18. The method of claim 15 wherein said photosensitive layer comprises a photoinitiator and a polymerizable monomer.

19. The method of claim 15 wherein said photoinitiator comprises one or more compounds selected from the group consisting of 2,3 -di (4-methoxyphenyl) quinoxaline, 9-phenyl acridine, bis(2,4,5-triphenyl-)imidazole, and their derivatives.

20. The method of claim 15 wherein said polymerizable monomer comprises one or more compounds selected from the group consisting of triethylene glycol dimethacrylate, tripopylene glycol diacrylate, tetraethylene glycol dimethacrylate diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

21. The method of claim 15 wherein said binders in the photosensitive layer comprises one or more compounds selected from the group consisting of polyvinyl acetals; styrene/maleic anhydride copolymers and their half esters; and acrylic resins.

22. The method of claim 15 wherein said photosensitive layer further comprises one or more ingredients selected from the group consisting of plasticizers, stabilizers, antistatic compositions, uv absorbers, dyes, pigments, surfactants, photoactivators, antihalation agents, hydrogen atom donors, optical brighteners, inert fillers, polymerization inhibitors, spectral sensitizers, and residual coating solvents.

23. The method of claim 15 wherein said optional adhesive layer of the photosensitive element comprises one or more thermoplastic polymers.

24. The method of claim 15 wherein said optional adhesive layer of the photosensitive element further comprises one or more ingredients selected from the group consisting of plasticizers, uv absorbers, antistatic compositions, inert fillers, antihalation agents, and optical brighteners.

25. The method of claim 15 wherein the polymeric film material comprises a single integral polymeric sheet having one white side and one black side.

26. The method of claim 15 wherein the polymeric film material comprises a single, white, integral polymeric sheet having a black coating on one side thereof.

27. The method of claim 15 wherein the polymeric film material comprises a single, black, integral polymeric sheet having a white coating on one side thereof.

28. The method of claim 15 wherein the polymeric film material comprises a white polymeric sheet and a black polymeric sheet adhered at an interface.

29. The method of claim 15 further comprising an addinional non-opaque, translucent white side material having a visible light opacity of from about 0.90 to about 0.99 on said black side.

30. The method of claim 15 wherein the polymeric film material comprises a single, black polymeric sheet having a white coating on both opposite sides thereof.

31. The method of claim 15 wherein the polymeric film material comprises two white polymeric sheets adhered at an interface to the opposite sides of a black polymeric sheet.

* * * * *